United States Patent [19]

Talmor

[11] Patent Number: 4,808,914

[45] Date of Patent: Feb. 28, 1989

[54] RESISTANCE MEASURING OHMS CONVERTER CIRCUIT EMPLOYING A CONSTANT CURRENT SOURCE

[75] Inventor: Shlomo S. Talmor, Syosset, N.Y.

[73] Assignee: Harris Corporation, Melbourne, Fla.

[21] Appl. No.: 788,236

[22] Filed: Oct. 17, 1985

[51] Int. Cl.[4] .............................................. G01R 27/02

[52] U.S. Cl. ...................................................... 324/62

[58] Field of Search ............... 324/62, 64; 307/296 R, 307/297

[56] References Cited

U.S. PATENT DOCUMENTS

| | | | |
|---|---|---|---|
| 2,995,704 | 8/1961 | Norgaard | 324/62 |
| 3,365,662 | 1/1968 | Wereb, Jr. . | |
| 3,633,098 | 4/1972 | Westlund . | |
| 3,646,436 | 2/1972 | Chan et al. . | |
| 3,711,850 | 1/1973 | Kelly . | |
| 3,919,601 | 11/1978 | Suko et al. . | |
| 3,978,472 | 8/1976 | Jones . | |
| 4,088,949 | 5/1978 | Goldish et al. . | |
| 4,092,591 | 5/1978 | Lozowski . | |
| 4,104,578 | 8/1978 | Thuot . | |
| 4,109,196 | 8/1978 | Carmody . | |
| 4,228,294 | 10/1980 | Crosby . | |
| 4,242,631 | 12/1980 | Hall . | |
| 4,323,972 | 4/1982 | Winter . | |
| 4,349,777 | 9/1982 | Mitamura | 324/62 |

*Primary Examiner*—Reinhard J. Eisenzopf
*Assistant Examiner*—Walter E. Snow
*Attorney, Agent, or Firm*—Scully, Scott, Murphy & Presser

[57] ABSTRACT

An ohms converter circuit for measuring the resistance of an unknown resistor Rx which monitors the actual output current of the current source employed therein to ensure its accuracy. The ohms converter circuit employs a highly stable current source which is protected against high voltage overloads. A current of known magnitude Iref is passed without branching through a series connection of Rx and a reference resistor Rref. Relays are utilized to switch between measurements of the voltage across Rx and the voltage across Rref. The voltage across Rref is checked periodically to verify the magnitude of the current of predetermined value Iref. The ohms converter establishes a loop circuit in which the current of known magnitude Iref passes through a scaler resistor to develop a voltage drop thereacross, which is connected with a floating potential in a loop circuit. A differential amplifier is coupled to differentially measure the voltages across the scaler resistor and the floating potential, and provides an output indicative thereof, which determines Iref. In this arrangement, the voltage drop across the scaler resistor equals the voltage drop across the floating potential, and the current Iref through the scaler resistor remains constant at a known magnitude. The current of known magnitude Iref also passes serially through the unknown resistor Rx, and a voltage measuring circuit measures the voltage across Rx to provide a precise determination thereof.

12 Claims, 4 Drawing Sheets

RESISTANCE MEASURING OHMS CONVERTER CIRCUIT EMPLOYING A CONSTANT CURRENT SOURCE

BACKGROUND OF THE INVENTION

1. Field of the Invention

The present invention relates generally to an ohms converter circuit for measuring the resistance of an unknown resistor, and more particularly pertains to an ohms converter circuit employing a highly stable current source which is protected against the accidental application thereto of high voltages.

2. Discussion of the Prior Art

In a digital multimeter, an ohms measurement is commonly performed by measuring the voltage drop produced across an unknown resistor with the application thereto of a known current flow. In order to get an accurate reading, two measurements must be performed simultaneously, namely the voltage drop across and the current flow through the unknown resistor. This measurement technique generally utilizes either a sample and hold circuit or two A/D converters. However, both approaches are generally unacceptable because mismatches and drift create errors in the measurements.

In lieu of performing simultaneous measurements, the approach of an ohms converter circuit can be employed, which utilizes a highly stable current source. Most ohms converter circuits regulate the voltage drop across the emitter resistor of a transistor, the collector of which is the output. With this approach, the beta of the output transistor changes with temperature and with changes of $V_{CE}$, which causes $I_C$ to change, thereby creating an inherent error. The ohms converter of the present invention eliminates this basic design flaw by monitoring the actual output current of the current source.

SUMMARY OF THE INVENTION

Accordingly, it is a primary object of the present invention to provide an ohms converter circuit for measuring the resistance of an unknown resistor which monitors the actual output current of the current source employed therein to ensure its accuracy.

A further object of the subject invention is the provision of an ohms converter circuit as described hereinabove which employs a highly stable current source which is protected against high voltage overloads. A practical requirement of an ohms converter circuit is that the circuitry should not be damaged by the accidental application thereto of a high voltage, as during measurements. The ohms converter of the present invention detects the application of a voltage overload, and in response thereto shuts off the current source. This also prevents the reference resistor from dissipating unnecessary power, thereby prolonging its life and maintaining its accuracy. Reverse or negative voltage overload protection for the ohms converter circuit is provided by a blocking diode which blocks an accidental application of a negative voltage across the input terminals from being applied to the ohms converter circuit. Additionally, positive voltage overload protection is provided by two clamping diodes, coupled between the circuit loop and ground, which provide high voltage overload for the circuit loop by clamping the anodes thereof to a given positive voltage. Additionally, a third clamping diode is provided such that when an extremely large resistor or an open circuit is presented across the input terminals of the circuit, the third clamping diode limits the voltage compliance of the ohms converter.

In accordance with the teachings herein, the ohms converter of the present invention measures an unknown resistance Rx by passing a current of known magnitude Iref through the unknown resistance and measuring the voltage drop thereacross, thereby allowing the resistance Rx to be determined by Ohm's law $R=V/I$.

The current of known magnitude Iref is passed without branching through a series connection of Rx and a reference resistor Rref. Relays are utilized to switch between measurements of the voltage across Rx and the voltage across Rref. The voltage across Rref is checked periodically to update the precise magnitude of Iref. The exact value of Iref is not important, but its precise value must be known and is determined by this measurement. Since the current supply provided by the present invention is very stable, the voltage across Rref has to be checked less frequently to verify Iref, and therefore the relays have to be switched less frequently, resulting in longer lives therefor. The current of known magnitude Iref is delivered by a highly stable current source, which avoids a prior art problem with the $V_{CE}$ and temperature dependence of an output transistor. The ohms converter of the present invention eliminates this basic design problem by monitoring the actual output current of the current source.

In accordance with the teachings herein, the ohms converter circuit of the present invention passes the current of known magnitude Iref through a scaler resistor to develop a voltage drop thereacross, which is connected with a floating potential in a loop circuit. A differential amplifier is coupled to differentially measure the voltages across the scaler resistor and the floating potential, and provides an output indicative thereof, which controls the generation of Iref. In this arrangement, the voltage drop across the scaler resistor equals the voltage drop across the floating potential, and the current Iref through the scaler resistor remains constant at a known magnitude. The current of known magnitude Iref is passed serially through the unknown resistor Rx, and a voltage measuring circuit measures the voltage across Rx to provide a precise determination of Rx, by knowing Vx and Ix, which is equal to Iref.

In greater detail, in one disclosed embodiment the floating potential preferably comprises a stable current source I and a floating potential resistor Rfp. An inverting amplifier is coupled to the output of the differential amplifier for providing enhanced voltage compliance and for isolation in the event of the accidental application of a high voltage to the circuit. The inverting amplifier is a transistor amplifier, and a voltage follower circuit is coupled to the floating potential resistor Rfp to prevent the current therethrough from flowing to the collector of the transistor inverting amplifier. Preferably, the stable current source includes an MOS amplifier, and the differential and inverting amplifiers and the voltage follower circuit also comprise MOS circuits.

BRIEF DESCRIPTION OF THE DRAWINGS

The foregoing objects and advantages of the present invention for an ohms converter circuit may be more readily understood by one skilled in the art with reference being had to the following detailed description of several preferred embodiments thereof, taken in conjunction with the accompanying drawings wherein like elements are designated by identical reference numerals throughout the several views, and in which.

DETAILED DESCRIPTION OF THE DRAWINGS

Figure 1:
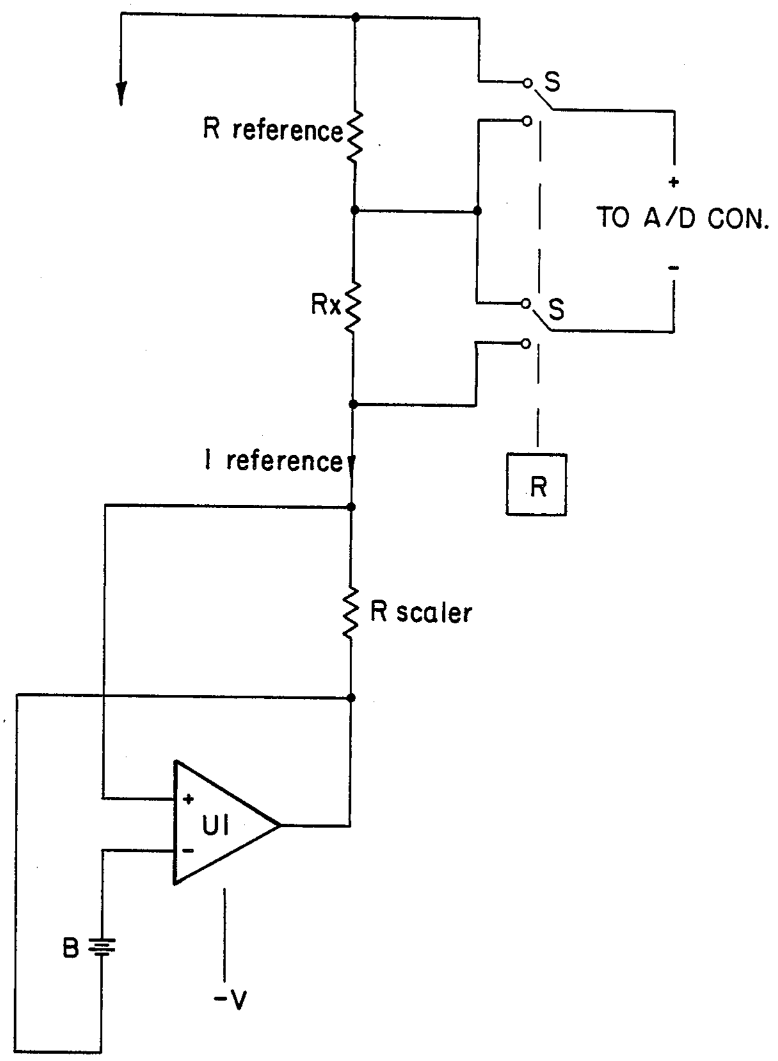
FIG. 1 is a schematic illustration of a simplified conceptual embodiment of an ohms converter circuit constructed pursuant to the teachings of the present invention.

Referring to the drawing in detail, the ohms converter of the present invention measures an unknown resistance Rx by passing a current of a known magnitude Iref through the unknown resistance and measuring the voltage drop thereacross, thereby allowing the resistance Rx to be determined by Ohm's law R=V/I.

FIG. 1 is a schematic illustration of a simplified conceptual embodiment of an ohms converter circuit pursuant to the teachings of the present invention. In this circuit, the voltage across a scaler resistor Rscaler is established by a current of known magnitude Iref passing therethrough. The voltage across the scaler resistor Rscaler is compared with a voltage supplied by a floating potential, generated in this embodiment by a battery B. A differential amplifier U1 compares the two voltages as inputs thereto, and controls the generation of the current of known magnitude Iref in accordance with the differential measurement of the voltages. In explanation of the operation of this circuit, any increase in the voltage drop across the scaler resistor Rscaler forces the noninverting input of U1 to become more positive than the inverting input thereof, causing the output of U1 to become more positive, such that the voltage drop across the scaler resistor is less and equals the voltage drop supplied by the floating potential, such that Iref=B/Rscaler.

The current of known magnitude Iref passes from Rscaler without branching through a series connection of Rx and a reference resistor Rref. Relays R are utilized to switch between measurements of the voltage across Rx and the voltage across Rref. The voltage across Rref is checked periodically to update the precise magnitude of Iref. The exact value of Iref is not important, but must be known and is determined by this measurement. Since the current supply provided by the present invention is very stable, the voltage across Rref has to be checked less frequently to verify Iref, and therefore the relays R have to be switched less frequently, resulting in longer lives therefor.

Figure 2:
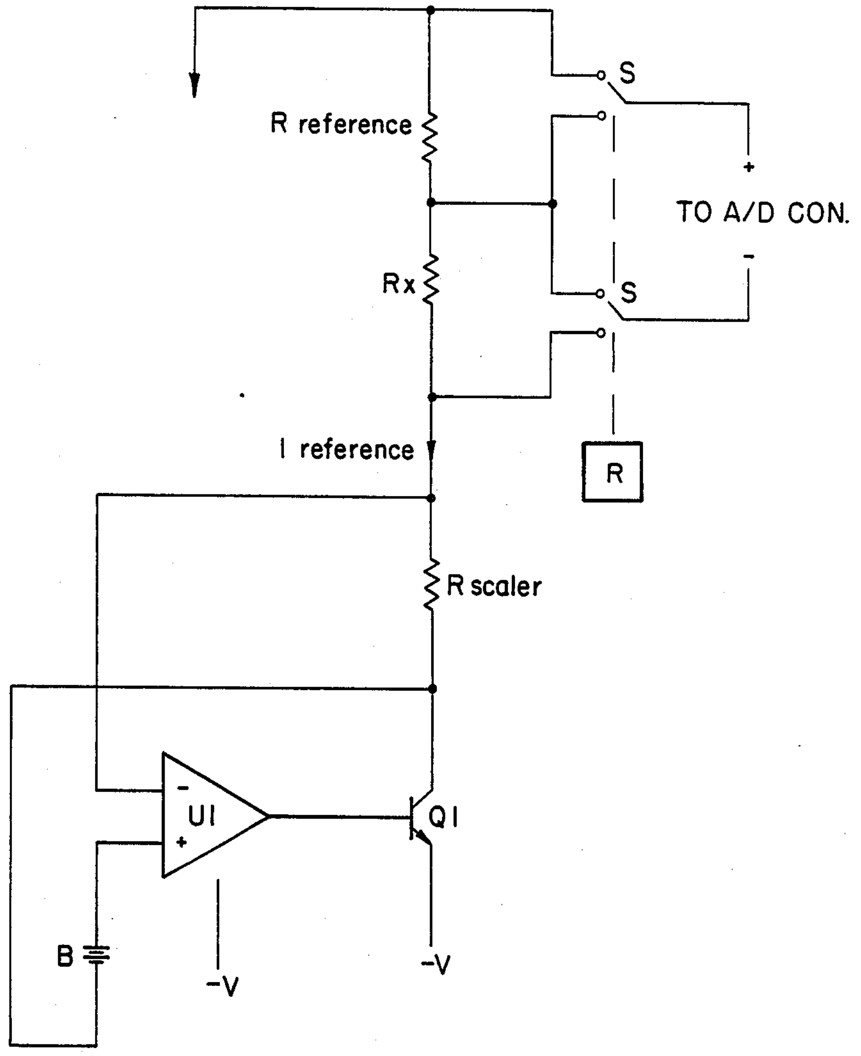
FIG. 2 illustrates a conceptual embodiment of an ohms converter circuit similar to that of FIG. 1, wherein an inverting amplifier has been added to the output of the differential amplifier.

FIG. 2 illustrates a conceptual embodiment of an ohms converter circuit similar to that of FIG. 1, wherein an inverting amplifier has been added to the output of the differential amplifier therein. In this circuit, the inputs to the differential amplifier U1 are reversed because of the introduction of an inverting amplifier Q1 within the circuit loop. In some circuits, an inverting amplifier transistor Q1 is essential to provide enhanced voltage compliance and the capability of withstanding the accidental application of high voltages thereto.

Figure 3:
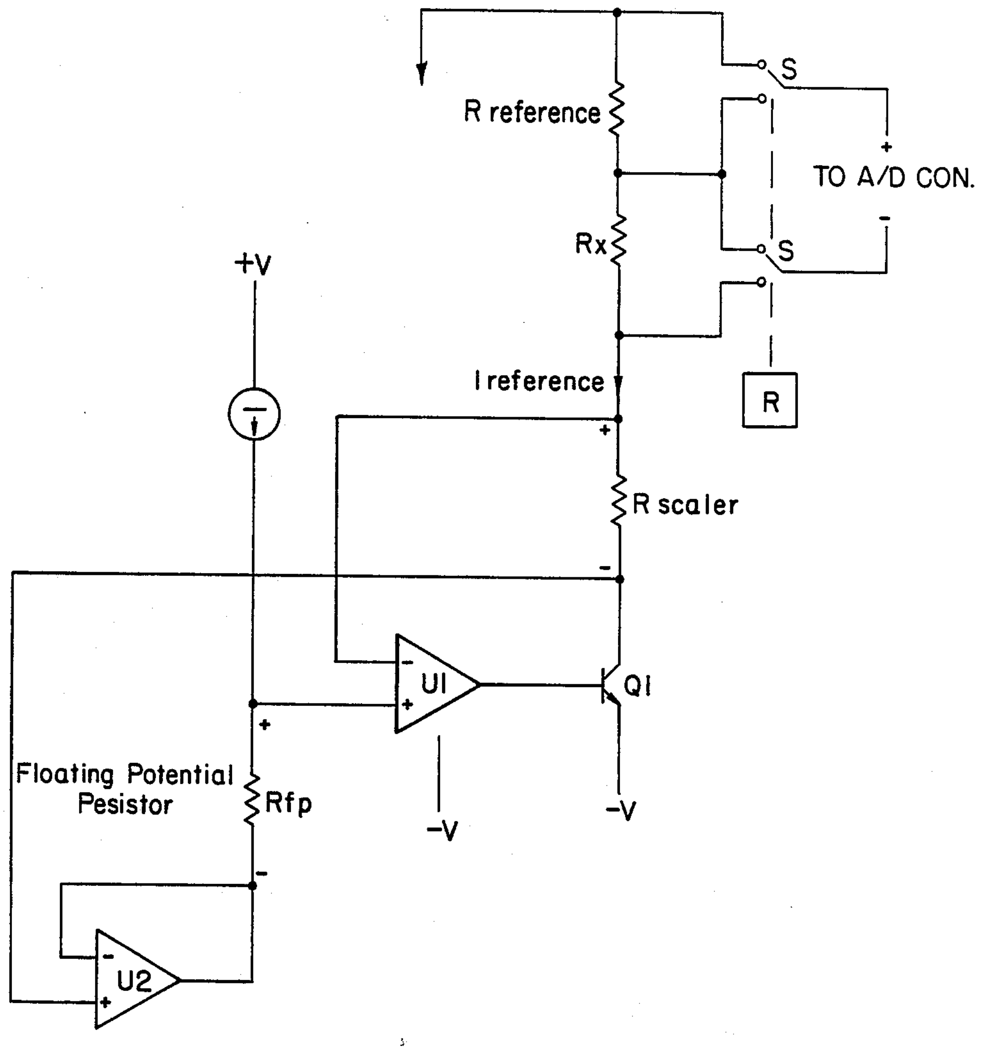
FIG. 3 illustrates a conceptual embodiment of an ohms converter circuit similar to that of FIG. 2, wherein a stable current source and floating potential resistor have replaced the floating potential battery.

FIG. 3 is a slightly more complex circuit than FIG. 2 in which the battery B is replaced by a stable current source I supplying a stable current to a floating potential resistor Rfp to provide a stable floating potential thereacross. In this circuit, U2 is a voltage follower preventing the current from I from flowing to the collector of Q1, thereby providing a buffering or isolation function in the circuit.

Figure 4:
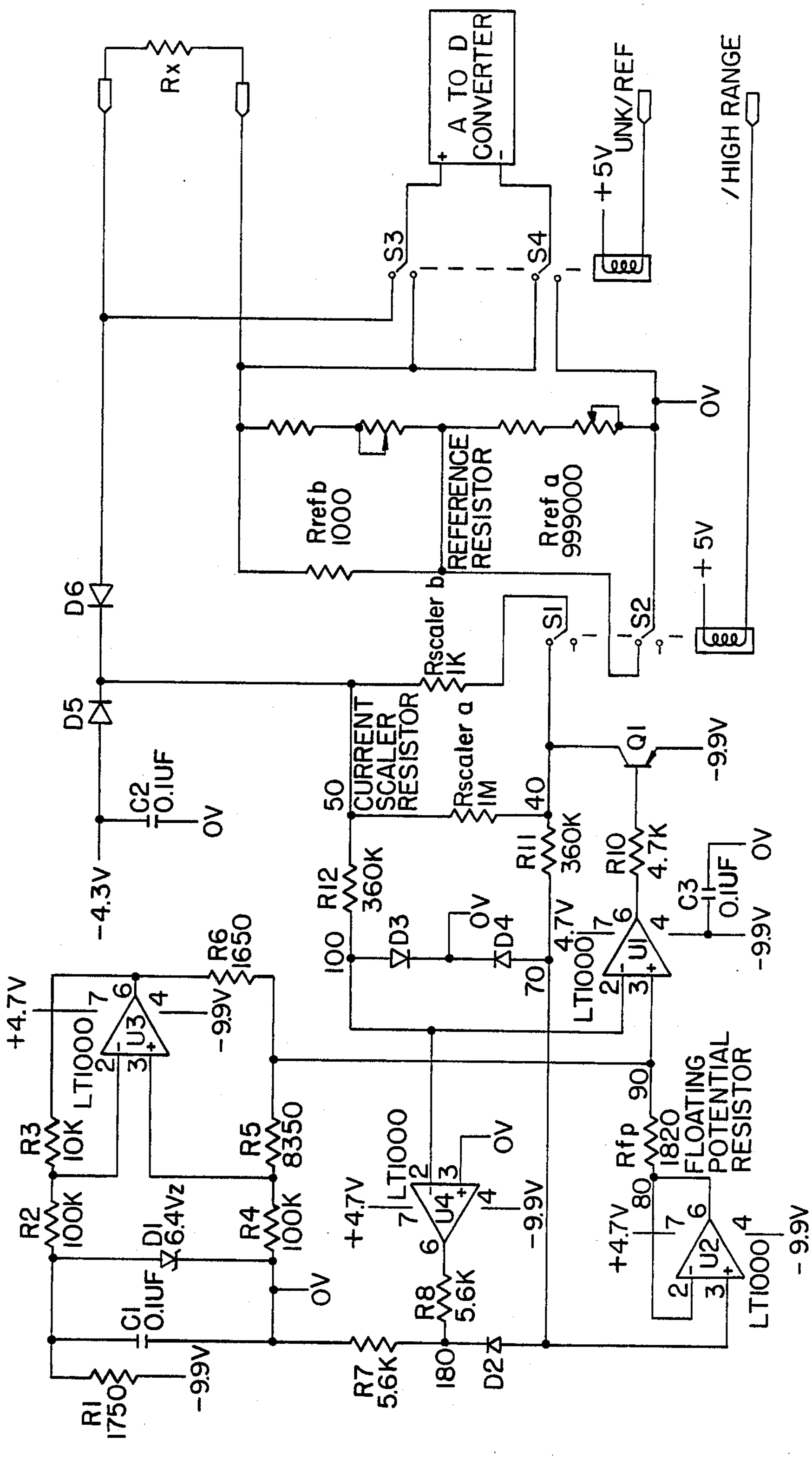
FIG. 4 is a schematic drawing of a preferred embodiment of an ohms converter circuit, similar in concept to FIG. 3, and illustrating fully the complete details of the circuit.

FIG. 4 is a schematic drawing of a preferred embodiment of an ohms converter circuit, similar in concept to FIG. 3, and illustrating fully the complete details of the circuit. In this embodiment, the stable current source I is provided by U3, which is an MOS amplifier, and a temperature compensated Zener diode D1. The stable current source I provides a stable current through the floating potential resistor Rfp to establish a stable bias voltage drop thereacross. U3 produces a constant current=(R3.Vz)/(R2.R6). The use of a temperature compensated Zener reference diode D1 reduces the temperature coefficient of this current source to just a few parts per million.

In this circuit, Iref is determined primarily by the floating potential and the magnitude of the current scaler resistor Rscaler, which is composed of Rscaler a and Rscaler b, and can be selectively changed by relay switch S1. When relay switch S1 is open, Rscaler consists of only Rscaler a which is 1 Mohms. When relay switch S1 is closed, Rscaler comprises both Rscaler a and Rscaler b in parallel, which is approximately equal to Rscaler b or 1 Kohms because of the much greater value of Rscaler a. In this embodiment, Iref can be selected between approximately 0.7 mAmps and 0.7 uAmps under control of relay R1.

In the embodiment of FIG. 4, Rref is actually formed by five interconnected resistors as shown for ease of construction, precision and switching, but could be just one resistor. In the designed embodiment Rref is either 1 Kohms or 1 Mohms, depending upon the desired value of Iref, which depends upon the anticipated value of Rx and the range of the voltmeter reading the voltage across either Rref or Rx. In this circuit, Rref consists of Rref a, which is 999 Kohms, and Rref b, which is 1 Kohms. When relay S2 is open, Rref is Rref a and Rref b, and when relay S2 is closed, Rref=Rref b only, such that Rref is precisely 1 Kohms or 1 Mohms. Switching by relay S2 is provided in order to maintain a low voltage drop over Rref. If, for instance, Rref=1 Mohms, and Iref=0.7 uAmps, then the voltage drop across Rref=0.7 volts, and when Iref is switched to 0.7 mAmps, the voltage over Rref will equal 700 volts. Therefore, it is desirable to scale Rref when Iref is scaled, such that relays S1 and S2 are switched simultaneously, as indicated by the dashed connection, with both being on or both being off.

Relays S3 and S4 are utilized to switch between measurements of the voltage across Rx and the voltage across Rref. The voltage across Rref is checked periodically to verify the precise magnitude of the current of predetermined value Iref. Since the current supply provided by the present invention is very stable, the voltage across Rref has to be checked less frequently to verify Iref, and therefor the relays S3 and S4 have to be switched less frequently, resulting in longer lives therefor. As illustrated, the voltmeter preferably includes an A to D converter for providing a digital output reading.

An inverting amplifier Q1 is connected in the loop circuit for providing the current of known magnitude Iref through the scaler resistor Rscaler, and establishes a voltage drop IrefRscaler thereacross equal to the voltage drop across Rfp. The inverting amplifier Q1 is coupled to the output of the differential amplifier U1 for providing enhanced voltage compliance and for isolation in the event of the accidental application of a high voltage to the circuit. The inverting amplifier is a transistor amplifier, and a voltage follower circuit U2 is coupled to the floating potential resistor Rfp to prevent the current therethrough from flowing to the collector of the transistor inverting amplifier Q1.

The ohms converter of the present invention detects the application of a voltage overload, and in response thereto shuts off Q1. This also prevents the reference resistor Rref from dissipating unnecessary power, thereby prolonging its life and maintaining its accuracy. Negative or reverse voltage overload protection for the ohms converter circuit is provided b a blocking diode D6, which blocks an application of a negative voltage to the circuit. Additionally, positive voltage overload protection is provided by two clamping diodes D3 and D4, coupled between the circuit loop and ground, which protect against positive high voltage overloads for the circuit loop by clamping the anodes thereof to a given positive voltage. Diodes D3 and D4 are low leakage (less than 1 pico amp.) diodes. A further clamping diode D5 is provided such that when Rx is an extremely large resistance, e.g. hundreds of Mohms, or an open circuit is provided instead of Rx, clamping diode D5 prevents the voltage at node 50 from being pulled down below −4.7 V to the lower potential of −9.9 V, and thereby possibly damaging a circuit under test. Diode D5 has its anode at −4.3 V, and will start conducting with a −0.4 V thereacross, such that the cathode thereof is clamped to −4.7 V.

In summary, the scaler resistor Rscaler is connected in a loop circuit in which the voltage drop across Rscaler is maintained equal to the voltage drop across a floating potential resistor Rfp. The resistor Rfp is connected to a stable constant current generator, such that the voltage drop across Rfp is maintained constant, and the voltage drop across Rscaler is thereby maintained constant, which results in a highly stable current through Rscaler. For reasons explained hereinbelow, the current through Rscaler does not branch at node 50 or otherwise, but proceeds as Iref through diode D6, through Rx and Rref.

The inputs of U1, U2 and U4 are MOS FET transistors, so the currents through R12 and R11 are very small, making the voltage drop over R12 and R11 less than 0.4 uV.

Therefore:

V70=V40 (voltage at node 70 equals voltage at node 40)

V100=V50

U2 is a voltage follower with no voltage drop thereacross, therefore:

V80=V70

V90=V80+RfpIfp

RfpIfp=0.7 V

U1 loop is closed via R10, Q1, Rscaler and R12 and it stabilized when:

V100=V90 which can also realized as:

V50=V90

V50=V80+0.7 V V50=V40+0.7 V

V50−V40=0.7 V so when Rscaler=1 Kohms, the circuit will output 0.7/1000=0.7 mA, and when Rscaler=1 Mohms, the circuit will output 0.7/1000=0.7 uA.

Q1, D5 and D6 are the only high voltage withstanding components, selected to withstand a minimum of 350 volts at the input terminals which are also the digital multimeter input terminals. D6 will block an application of −5 to −350 volts.

When a positive voltage is applied to the output terminals, D6 conducts, and since the current source initially continues to operate, it will require over 1.2 volts to bring V50 to a voltage more positive than ground. U4 is used as a comparator, and will flip to output −9.9 V (in normal operation V50 is always more negative than ground so the U4 output is at +4.7 V), node 180 will change from +2.35 V to −4.95 V, D2 will conduct and node 70 will follow node 180 to −4.3 V. Node 90 will then be −4.3 V+0.65 V=3.65 V, with +0.4 V at the inv. input and −3.65 V at the noninv. input, the output of U1 will go all the way to the negative rail, and Q1 will be turned off.

The maximum power that Rref will be dissipating, in the Mohms range with +350 V at the MDMM input, is $((350/(1000+360{,}000+1{,}000{,}000))^2.1{,}000{,}000=66$ mW.

In ranges where 1 Kohms is being utilized, V50 follows the input with a minimal voltage drop over Rref, hence V50 can get as high as 350 V, therefore D5 is a high voltage diode with low reverse leakage, less than 500 pA at 25° C. and full reverse voltage.

In accordance with the teachings herein, the present invention provides an ohms converter circuit designed to produce an output constant current of 0.7 mA or 0.7 uA, with a voltage compliance of 4.7 Volts. The constant current flows through a reference resistor Rref (1 Kohms or 1 Mohms) with no possible current branching (Iscaler=Iref).

The current source is electrically and electrostatically isolated (floating), and can withstand an application of up to +/−350 volts to its output terminals.

The circuit eliminates any possible current branching between Rscaler and Rx, and prevents damages to Rref when a high voltage is connected to the input of the digital multimeter (DMM) while in an ohms measurement mode.

While several preferred embodiments of the present invention for an ohms converter circuit are described in detail herein, it should be apparent that the disclosure and teachings of the present invention will suggest many alternative designs to those skilled in the art.

What is claimed is:

1. An ohms converter circuit for measuring an unknown resistor Rx by passing a current of known magnitude Iref therethrough and measuring the voltage drop thereacross, comprising:

a. a scaler resistor Rscaler, coupled in series with the unknown resistor Rx, having the current of known magnitude Iref passing therethrough to develop a voltage drop thereacross;

b. a floating potential connected in a loop circuit;

c. a differential amplifier coupled with the voltage across the scaler resistor Rscaler placed across the output and one differential input of the differential amplifier and the voltage across the floating potential placed across the output and a second differential input of the differential amplifier to form said loop circuit, to differentially measure the voltages across the scaler resistor and said floating potential and provide an output indicative thereof which determines Iref, such that the voltage drop across the floating potential and the current Iref through said scaler resistor remains constant at a known magnitude, said current of known magnitude Iref also passing serially through the unknown resistor Rx;

d. an inverting amplifier coupled between the output of said differential amplifier and a commom coupling to said scaler resistor Rscaler and said floating potential, for providing enhanced voltage compliance and for voltage isolation in the event of the accidental application of a high voltage to the circuit;

e. a voltage measuring means for measuring the voltage across Rx to provide a precise measurement of Rx, by knowing Vx and Ix which is equal to Iref;

f. a reference resistor Rref coupled in series with the unknown resistor Rx; and g. means for switching said voltage measuring means across either the unknown resistor Rx or said reference resistor Rref, for measuring the voltage across either the unknown resistor Rx or said reference resistor Rref, with the measurement of the voltage across Rref providing a precise measurement of Iref, by knowing Vref and Rref, and the measurement of the voltage across Rx providing a precise measurement of Rx.

2. An ohms converter circuit for measuring an unknown resistor Rx by passing a current of a known magnitude therethrough and measuring the voltage drop thereacross, as claimed in claim 1, the unknown resistor Rx being coupled to the ohms converter circuit through a serially connected blocking diode which provides reverse high voltage overload protection for the ohms converter circuit.

3. An ohms converter circuit for measuring an unknown resistor Rx by passing a current of a known magnitude therethrough and measuring the voltage drop thereacross, as claimed in claim 2, said loop circuit further comprising two clamping diodes coupled between the circuit loop and ground which provide high voltage overload protection for the loop circuit by clamping the anodes thereof to a given positive voltage.

4. An ohms converter circuit for measuring an unknown resistor Rx by passing a current of a known magnitude therethrough and measuring the voltage drop thereacross, as claimed in claim 3, further including a third clamping diode, coupled between the unknown resistor Rx and ground, to limit the voltage compliance of the ohms converter circuit, when an extremely large resistor or an open circuit is presented across the input terminals where Rx is normally connected.

5. An ohms converter circuit for measuring an unknown resistor Rx by passing a current of a known magnitude therethrough and measuring the voltage drop thereacross, as claimed in claim 1, said floating potential comprising a stable current source I and a floating potential resistor Rfp coupled in series with the stable current source I to provide a voltage across said floating potential resistor Rfp which is placed across said second differential input of the differential amplifier.

6. An ohms converter circuit for measuring an unknown resistor Rx by passing a current of a known magnitude therethrough and measuring the voltage drop thereacross, as claimed in claim 5, wherein said inverting amplifier is a transistor amplifier, and further including a voltage follower circuit coupled to said floating potential resistor to prevent the current through said floating potential resistor from flowing to the collector of said inverting amplifier which is a transistor inverting amplifier.

7. An ohms converter circuit for measuring an unknown resistor Rx by passing a current of a known magnitude therethrough and measuring the voltage drop thereacross, as claimed in claim 6, the unknown resistor Rx being coupled to the ohms converter circuit through a serially connected blocking diode which provides reverse high voltage overload protection for the ohms converter circuit.

8. An ohms converter circuit for measuring an unknown resistor Rx by passing a current of a known magnitude therethrough and measuring the voltage drop thereacross, as claimed in claim 7, said loop circuit further comprising two clamping diodes coupled between the circuit loop and ground which provide high voltage overload protection for the loop circuit by clamping the anodes thereof to a given positive voltage.

9. An ohms converter circuit for measuring an unknown resistor Rx by passing a current of a known magnitude therethrough and measuring the voltage drop thereacross, as claimed in claim 8, further including a third clamping diode, coupled between the unknown resistor Rx and ground, to limit the voltage compliance of the ohms converter circuit, when an extremely large resistor or an open circuit is presented across the input terminals where Rx is normally connected.

10. An ohms converter circuit for measuring an unknown resistor Rx by passing a current of a known magnitude therethrough and measuring the voltage drop thereacross, as claimed in claim 9, said stable current source I including an MOS amplifier, and said differential and inverting amplifiers and said voltage follower circuit also comprising MOS circuits.

11. An ohms converter circuit for measuring an unknown resistor Rx by passing a current of a known magnitude therethrough and measuring the voltage drop thereacross, as claimed in claim 10, said stable current source including a Zener diode, coupled across the inputs of said stable current source MOS amplifier, for providing temperature compensation therefor.

12. An ohms converter circuit for measuring an unknown resistor Rx by passing a current of a known magnitude therethrough and measuring the voltage drop thereacross, as claimed in claim 5, wherein said inverting amplifier comprises an inverting transistor amplifier coupled to the output of said differential amplifier, and a voltage follower circuit coupled to said floating potential resistor to prevent the current through said floating potential resistor from flowing to the collector of said inverting transistor amplifier.

* * * * *